United States Patent [19]

Singh et al.

[11] 4,380,778

[45] Apr. 19, 1983

[54] CONTROL ASSEMBLY FOR REMOTE SWITCHING

[76] Inventors: Manohar A. Singh; Manohar Mudhar, both of 162 Spadina Rd., #201, Toronto, Ontario, Canada, M5R 2T8

[21] Appl. No.: 260,712

[22] Filed: May 5, 1981

[51] Int. Cl.³ .......................... H04N 5/44; H03J 9/04
[52] U.S. Cl. .................... 358/194.1; 74/10 A; 334/9
[58] Field of Search .................... 358/194.1; 455/151, 455/153, 352–355; 334/8–10; 74/10 R, 10 A, 548; 318/16

[56] References Cited

U.S. PATENT DOCUMENTS

| | | | |
|---|---|---|---|
| 3,290,602 | 12/1966 | Hayden et al. | 455/151 |
| 3,984,779 | 10/1976 | Hughes | 455/153 |
| 3,988,680 | 10/1976 | Kolm | 358/194.1 |

Primary Examiner—John C. Martin
Attorney, Agent, or Firm—Sim & McBurney

[57] ABSTRACT

There is provided, for an appliance having an operating shaft with a non-circular end section, the control assembly which includes a drive means, a coupling member, and mounting means for mounting the drive means non-rotatably on the appliance. The drive means has a low-speed, high-torque output shaft, and the coupling member has a first opening to receive the operating shaft and a second opening aligned with the first opening, the second opening being engagable with the output shaft. The first opening is complementary to the non-circular end section of the operating shaft, whereas the second opening and the output shaft are engagable to provide a lost-motion connection that allows the output shaft to engage the second opening over a wide angular range while still allowing the output shaft to engage and drive the coupling member.

8 Claims, 5 Drawing Figures

CONTROL ASSEMBLY FOR REMOTE SWITCHING

This invention relates generally to control assemblies for appliances, and is to do particularly with a control assembly especially adapted to change channels on a television set. The control assembly may be actuated remotely, as by known ultrasonic techniques, or may be operated electrically through switching mechanisms.

BACKGROUND OF THIS INVENTION

It is already known to provide remotely controlled switching devices for appliances such as television receivers. Typically, a television receiver, as purchased, includes a channel selector knob which fits on and is adapted to rotate a shaft projecting outwardly from the chassis of the television receiver. The shaft is typically of non-circular end section, and in most cases is semi-circular or nearly so. The control knob has a complementary recess for receiving this shaft.

One approach to making the television receiver remotely controllable is exemplified in U.S. Pat. No. 3,984,779. This patent, issued Oct. 5, 1976 to Hughes, discloses the provision of a motorized drive which includes a gear reducer and which provides low-speed high-torque rotary movement on a drive shaft having a semi-circular end section. Mounting means are provided to align this drive shaft with the control shaft projecting from and forming part of the television receiver. A cylindrical coupling is provided having two semi-circular openings at opposite ends, the one opening receiving the the drive shaft and the other fitting over the control shaft of the television receiver.

There is, however, a difficulty which arises in connection with the mounting of such a control assembly on an existing television receiver. The difficulty relates to the facts that (a) the control shaft for the television receiver has normally a specific number of discrete angularly separated positions in which it is "at rest" (on many television sets the control shaft cannot be turned to and left at an intermediate position between these discrete angular positions which correspond with the particular channels); (b) the drive shaft, which is rotatable through the gear reduction mechanism by (typically) a small electrical motor, cannot be turned by hand, due to the gear reducing mechanism. Now, in the case of the apparatus shown in U.S. Pat. No. 3,984,779, the housing for the motor, from which the drive shaft extends, has one particular orientation with respect to the housing for the television receiver, due to the way in which it is mounted. Hence, it is not possible to swivel the motor housing about with respect to the drive shaft in order to achieve a proper fit. Thus, if it happens that the "at rest" position of the control shaft extending from the television receiver is not exactly aligned rotationally with the drive shaft extending from the motor housing when it is in its mounted position, it will literally not be possible to position the coupling member between them. The drive shaft cannot be rotated, and typically the control shaft will not maintain itself in any intermediate position.

This latter problem is bound to create difficulties for the purchaser who has bought one of the control assemblies and who is attempting to mount it on his television receiver.

Accordingly, it is an aim of this invention to overcome the problem of angular mismatch between the output drive shaft of the drive means and the control shaft of the television receiver, or other appliance to which the assembly of this invention is to be fitted.

GENERAL DESCRIPTION OF THIS INVENTION

More particularly, this invention provides, for use with an appliance having an operating shaft with a non-circular end section, a control assembly which includes a drive means, a coupling member and a mounting means. The drive means includes a low-speed high-torque output shaft. The coupling member has a first opening which is complementary to the non-circular end section of the operating shaft and which is adapted to receive the operating shaft. The coupling member also has a second opening aligned with the first one, the second opening and the output shaft being engagable to provide a lost-motion connection which allows the output shaft to engage the second opening over a wide angular range while still allowing the output shaft to engage and drive the coupling member. The mounting means is adapted to mount the drive means non-rotatably on the appliance. In a preferred embodiment, the output shaft is cylindrical with two diametrally opposed longitudinal splines projecting therefrom, and the said second opening is circular in section with a diameter greater than the distance between the tops of the splines. The second opening has two inwardly projecting longitudinal ribs which are sized so as to mechanically interfere with the splines when the output shaft is rotated sufficiently far to bring the ribs into contact with the splines.

GENERAL DESCRIPTION OF THE DRAWINGS

One embodiment of this invention is illustrated in the accompanying drawings, in which like numerals denote like parts throughout the several views, and in which.

DETAILED DESCRIPTION OF THE DRAWINGS

Figure 1:
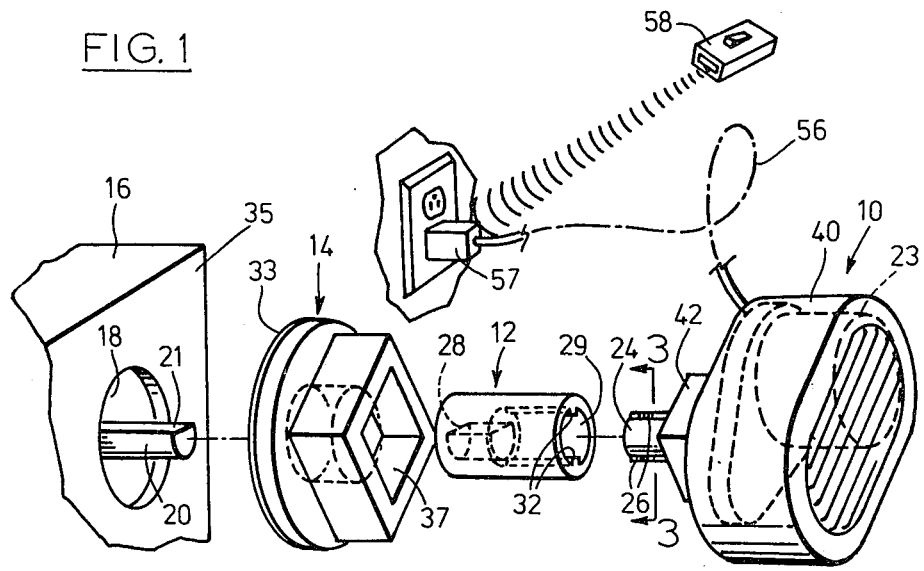
FIG. 1 is an exploded view of the various components of the apparatus of this invention, shown in juxtaposition to a portion of an appliance to which the apparatus is to be attached.

Attention is first directed to FIG. 1, which shows the basic components of this apparatus to include a drive means 10, a coupling member 12 and a base member 14 of a mounting means.

Also in FIG. 1 is shown a corner of a television or similar appliance 16 having an opening 18 in its housing, through which projects the end of an operating shaft 20. As can be seen in FIG. 1, the operating shaft has a non-circular end section which, as is conventional, is substantially semi-circular. In actual fact, many such shafts are such that the flat surface 21 is not precisely on a diameter of the cylinder, but rather is slightly spaced away from the center of the cylinder, so that the section constitutes slightly more than a semi-circle.

Figure 3:
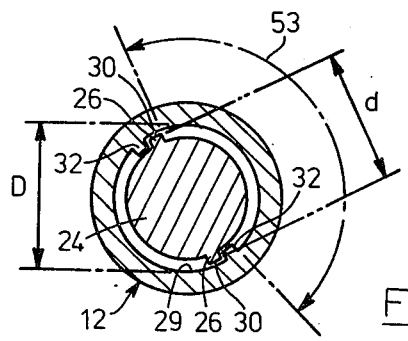
FIG. 3 is a sectional view taken on the line 3—3 in FIG. 1, when the appropriate pieces are fitted together.

The drive means 10, in the embodiment shown, includes a small electric motor 23 (shown in broken lines), and internal means which allows the high-speed, low-torque output of the motor 23 to be converted to a low-speed, high-torque output on a shaft 24. The conversion means typically includes a reduction gearing train (not shown). As can be seen in FIGS. 1 and 3, the output shaft 24 is basically cylindrical, with two diametrally opposed longitudinal splines 26 projecting therefrom.

The coupling member 12 can be seen to include a first opening 28 which is complementary to the non-circular end of the operating shaft 20, as well as a second opening 29 which is aligned with the first opening 28. More specifically, the first opening is also of substantially semi-circular section, so as to complementally receive the shaft 20. The second opening 29 is essentially circular in section, and has a diameter D (see FIG. 3) between the tops 30 of the splines 26. The second opening 29 also has two inwardly projecting longitudinal ribs 32 which are sized so as to have a mechanical interference with the splines 26, when the output shaft 24 is rotated within the second opening 29 sufficiently far to bring the ribs 32 into contact with the splines 26.

Returning to FIG. 1, the base 14 has a flat base surface 33 provided with a contact adhesive to enable it to be affixed to the wall 35 of the appliance 16. The base member 14 also has a central opening 37 which is intended to be aligned with the opening 18 in the wall 35, and which is such as to permit the coupling member 12 to have access to the operating shaft 20. The outer or rightward portion of the central opening 37 has a non-circular section shown in FIG. 1 to be a square section, and the drive means 10 includes, projecting outwardly from its housing 40, a projecting means 42 which surrounds the output shaft 24 and which has a section complementary to and receivable within the opening 37. More particularly, the projecting means 42 is simply an integral lock portion of square section, adapted to be received in a press-fit inside the square opening 37.

Figure 2:
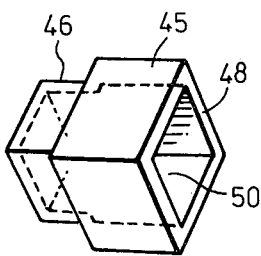
FIG. 2 is a perspective view of an additional extension piece for use with the apparatus shown in FIG. 1.

Returning now to FIG. 2, the apparatus of this invention may optionally include an extension member 45 which has a first end 46 adapted to fit snugly and complementally within the central opening 37 of the base member 14, a second end 48 adapted snugly and complementally to receive the projecting means 42 on the drive means 10, and an opening 50 through which the coupling member 12 may pass.

It will be appreciated that, in cases where the operating shaft 20 extends a considerable distance outwardly from the housing of the appliance 16, it may be necessary to space the drive means 10 further away from the wall of the appliance 16 by using the extension member 45. This is done by first affixing the base 14 to the appliance 16 in the usual way, then inserting the extension member 45 as described early, then inserting the projecting means 42 of the drive means 10 into the opening 50 of the extension member 45.

Returning now to FIG. 3, it can be appreciated that the output shaft 24 on the drive means 10 can be received within the second opening 29 of the coupling member 12 in any angular orientation except the one in which the splines 26 and the ribs 32 are lined up and would interfere with each other. However, as can be seen in FIG. 3, there is a very large angle 53, approximately 150 degrees, through which the shaft 24 can be turned with respect to the coupling member 12, and still be within the opening 29. It is only the remaining 30 degrees or so (out of 180 degrees) which these two members must avoid if they are to be brought together into registry. It will thus be seen that the disadvantage of the prior art, as exemplified by the Hughes patent, is overcome by the apparatus disclosed herein. Since only 30 degrees out of 180 degrees (60 degrees out of 360 degrees) is "prohibited" in terms of the angular orientation of the shaft 24 with respect to the shaft 20, it is a very simple matter to fit all of the pieces together into an operational assembly.

In order to mount the assembly, the base member 14 is first placed against and affixed to the appliance 16, centered over the shaft 20. Then, the coupling member 12 is fitted on the shaft 20, and finally the drive member 10 is arranged with its shaft 24 in registry with the second opening 29 in the coupling member 12, and the projecting means 42 received in a press fit into the square opening 37 of the base member 14.

As seen in FIG. 1, the drive means 10, and more specifically the electric motor 23 thereof, is energized through an electrical wire 56, which is controlled by an ultrasonic receiver device 57 associated with the plug for the drive means 10. An ultrasonic transmitter 58 which may be manually operable, is adapted to emit the ultrasonic signals which are picked up by the ultrasonic receiver 57, and translated into a control for the drive means 10. The operation of the ultrasonic transmitter and receiver, and of the means which interprets the ultrasonic signals and controls the drive means in accordance therewith, forms no part of this invention and does not need to described in any greater detail.

It will be evident from what has been described above that, regardless of the initial angular orientation of the output shaft 24 with respect to the opening 29 and the coupling member 12, the output shaft 24 can be brought into driving engagement with respect to the operating shaft 20 simply by allowing the drive means 10 to run until the splines 26 come into contact with the ribs 32, in the arrangement shown in FIG. 3. Once this has been accomplished, even though this may require several seconds of running the drive means 10, no further "lost motion" operation will be required, because the "slack" will have been completely taken up. From that point on, the drive means 10 will directly begin to rotate the operating shaft 20 as soon as the drive means 10 is energized.

Figure 4:
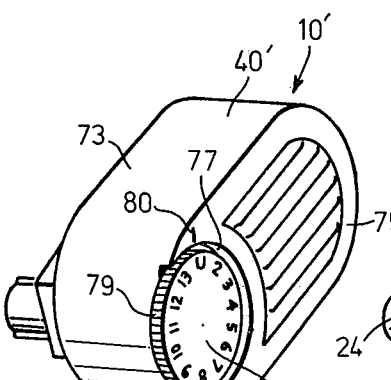
FIG. 4 is a perspective view of one of the components of the apparatus of this invention, showing a variant thereof.
Figure 5:
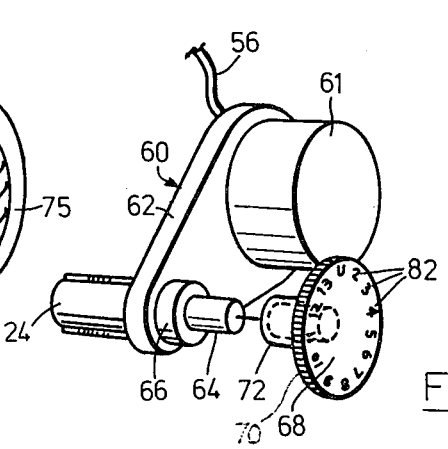
FIG. 5 is an exploded perspective view of the essential parts of the component shown in FIG. 4.

Attention is now directed to FIGS. 4 and 5. The variant shown in these figures is particularly useful with television receivers, especially for those which do not display the channel number at a location spaced from the control shaft 20.

The component shown in FIGS. 4 and 5 is a drive means 10', which has the same function as the drive means 10 shown in FIG. 1. However, the drive means 10' shown in FIGS. 4 and 5 includes a capability for displaying the channel number which the apparatus selects.

With reference to FIG. 5, the drive means 10' includes a motor and gear assembly 60 having a motor housing 61 containing and protecting the electric motor, and a gear housing 62 containing and protecting a reduction gear train. Neither the motor nor the gear train are shown, nor do they need to be since both are conventional.

The shaft 24 is identical to the shaft 24 shown in FIG. 1, and therefore is identified by the same numeral. In the variant shown in FIGS. 4 and 5, the shaft 24 extends through the housing 62 to provide a drive shaft extension 64 which is unitary with the shaft 24, and therefore rotates therewith. A boss 66 on the housing 62 supports the drive shaft extension 64.

A display knob 68 is provided, being substantially discal in shape with a knurled edge 70 and a shaft 72 which provides an internal female connection adapted to receive the drive shaft extension 64. The shafts 64 and 72 are not keyed together, but are dimensioned in such a way as to provide a friction grip which can nonetheless be overcome by circumferentially directed force applied to the knurled edge 70 of the display knob. Typically, the internal cavity in the shaft 72 would be perfectly cylindrical, and would be about 1/1000" larger in diameter than the cylindrical drive shaft extension 64. This would normally provide the necessary friction grip between these two elements.

As can be seen in FIG. 4, the drive means 10' includes a housing 40' which has a side wall 73 and a front wall 75 has a circular recess or removed portion 77 only slightly larger than the outer perimeter of the plastic knob 68.

As can be seen in FIG. 4, the plastic knob 68 is adapted to extend somewhat beyond the side wall 73 of the location identified by the numeral 79, in order that the user can apply thumb or finger pressure against the knurled edge 70 of the plastic knob 68, thus turning it. As can also be seen in FIG. 4, the front wall 75 has a reference mark 80, which is intended to indicate to the user the channel to which the television set is adjusted.

In use, the user will apply the control assembly as previously described, and will operate the control assembly until the television set arrives at a channel of which he recognizes the number. He would then turn the plastic knob 68 until that same number registers against the reference mark 80. Subsequently, as the shaft 24 rotates and changes the channel, the plastic knob 68 will also rotate in unison, thereby bringing different ones of the numbers 82 into registry with the reference mark 80.

We claim:

1. For use with an appliance having an operating shaft with a non-circular end section, a control assembly comprising:
    a drive means having a low-speed, high-torque output shaft,
    a coupling member having a first opening complementary to said non-circular end section and adapted to receive the operating shaft, and having a second opening aligned with the first, the second opening and said output shaft being engagable to provide a lost-motion connection that allows the output shaft to engage the second opening over an angular range while still allowing the output shaft to engage and drive the coupling member,
    mounting means for mounting the drive means non-rotatively on the appliance,
    said output shaft being cylindrical with two diametrally opposed longitudinal splines projecting therefrom, the said second opening being circular in section with a diameter greater than the distance between said tops of the splines, and having two inwardly projecting longitudinal ribs sized so as to have mechanical interference with said splines when the output shaft is rotated within said second opening sufficiently far to bring the ribs into contact with the splines.

2. The control assembly claimed in claim 1, in which the output shaft is cylindrical with two diametrally opposed longitudinal splines projecting therefrom, and in which the said second opening is circular in section with a diameter greater than the distance between said tops of the splines, and has two inwardly projecting longitudinal ribs sized so as to have mechanical interference with said splines when the output shaft is rotated within said second opening sufficiently far to bring the ribs into contact with the splines.

3. The control assembly claimed in claim 1, in which the mounting means includes a base member defining a surface which can be affixed to the appliance and a central opening through which the coupling member can have access to the operating shaft of the appliance, said central opening having a non-circular section, and projecting means on the drive means surrounding the output shaft and having a section complementary to and receivable within said central opening.

4. The control assembly claimed in claim 3, in which the section of the central opening is square, and in which the projecting means is a press-fit inside said central opening.

5. The control assembly claimed in claim 3 or claim 4, which further comprises an extension member having a first end adapted to fit snugly and complementally within said central opening, a second end adapted snugly and complementally to receive said projecting means, and an opening through the extension member through which the coupling member may pass.

6. The control assembly claimed in claim 1 or claim 3, in which the coupling member is cylindrical.

7. The control assembly claimed in claim 1 or claim 3, in which the drive means includes an electrical motor in a housing, and which further comprises means for electrically energizing said electric motor, an ultrasonic receiver for controlling electrical energy to said drive motor, and an ultrasonic remote transmitter for selectively operatining said ultrasonic receiver.

8. For use with an appliance having an operating shaft with a non-circular end section, a control assembly comprising:
    a drive means having a low-speed, high-torque output shaft,
    a coupling member having a first opening complementary to said non-circular end section and adapted to receive the operating shaft, and having a second opening aligned with the first, the second opening and said output shaft being engagable to provide a lost-motion connection that allows the output shaft to engage the second opening over an angular range while still allowing the output shaft to engage and drive the coupling member,
    mounting means for mounting the drive means non-rotatively on the appliance,
    the drive including a visible knob aligned with said output shaft, the knob being in frictional connection with respect to said output shaft, but being rotatable with respect thereto upon the application of circumferentially directed force, the knob having indicia around its periphery to identify positions to which the output shaft has rotated the operating shaft.

* * * * *